United States Patent
Cheng et al.

(10) Patent No.: US 10,840,148 B1
(45) Date of Patent: Nov. 17, 2020

(54) ONE-TIME PROGRAMMABLE DEVICE COMPATIBLE WITH VERTICAL TRANSISTOR PROCESSING

(71) Applicant: International Business Machines Corporation, Armonk, NY (US)

(72) Inventors: Kangguo Cheng, Schenectady, NY (US); Juntao Li, Cohoes, NY (US); Ruilong Xie, Niskayuna, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/411,305

(22) Filed: May 14, 2019

(51) Int. Cl.
*H01L 21/8234* (2006.01)
*H01L 27/112* (2006.01)
(Continued)

(52) U.S. Cl.
CPC ...... *H01L 21/823487* (2013.01); *G11C 17/12* (2013.01); *H01L 21/02532* (2013.01); *H01L 21/823814* (2013.01); *H01L 21/823835* (2013.01); *H01L 21/823864* (2013.01); *H01L 21/823885* (2013.01); *H01L 27/0922* (2013.01); *H01L 27/10864* (2013.01); *H01L 27/10876* (2013.01); *H01L 27/10879* (2013.01); *H01L 27/11206* (2013.01); *H01L 27/11273* (2013.01); *H01L 27/2454* (2013.01); *H01L 29/0847* (2013.01); *H01L 29/16* (2013.01);
(Continued)

(58) Field of Classification Search
CPC ..... H01L 21/823487; H01L 21/823885; H01L 27/10841; H01L 27/10864; H01L 27/10876; H01L 27/10879; H01L 27/11273; H01L 27/11556; H01L 27/11582; H01L 27/2454; H01L 29/66272; H01L 29/66666; H01L 29/7788; H01L 29/7827; H01L 29/78642; H01L 29/7889; H01L 29/7926
See application file for complete search history.

(56) References Cited

U.S. PATENT DOCUMENTS 5,072,276 A * 12/1991 Malhi ................. H01L 27/0688
257/328
6,242,775 B1 * 6/2001 Noble ............ H01L 21/823885
257/330
(Continued)

*Primary Examiner* — Eduardo A Rodela
(74) *Attorney, Agent, or Firm* — Douglas Pearson; Ryan, Mason & Lewis, LLP

(57) ABSTRACT

A method for manufacturing a semiconductor device includes forming a plurality of fins on a semiconductor substrate, forming a first bottom source/drain region at sides of a first fin of the plurality of fins in a first transistor region, and forming a second bottom source/drain region at sides of a second fin of the plurality of fins in a second transistor region. The first and second bottom source/drain regions are oppositely doped. In the method, a bottom spacer layer is formed on the first and second bottom source/drain regions, and the bottom spacer layer is removed from the second bottom source/drain region. A high-k dielectric layer is formed on the bottom spacer layer in the first transistor region, and directly formed on the second bottom source/drain region in the second transistor region. The method also includes forming a gate conductor on the high-k dielectric layer.

20 Claims, 5 Drawing Sheets

(51) Int. Cl.
    *H01L 29/78*      (2006.01)
    *H01L 29/08*      (2006.01)
    *H01L 29/16*      (2006.01)
    *H01L 21/8238*    (2006.01)
    *H01L 29/66*      (2006.01)
    *H01L 21/02*      (2006.01)
    *G11C 17/12*      (2006.01)
    *H01L 29/165*     (2006.01)
    *H01L 27/092*     (2006.01)
    *H01L 27/108*     (2006.01)
    *H01L 29/792*     (2006.01)
    *H01L 29/786*     (2006.01)
    *H01L 29/788*     (2006.01)
    *H01L 27/24*      (2006.01)
    *H01L 29/778*     (2006.01)

(52) U.S. Cl.
    CPC ........ *H01L 29/165* (2013.01); *H01L 29/6653* (2013.01); *H01L 29/66272* (2013.01); *H01L 29/66553* (2013.01); *H01L 29/66666* (2013.01); *H01L 29/7788* (2013.01); *H01L 29/7827* (2013.01); *H01L 29/7848* (2013.01); *H01L 29/7889* (2013.01); *H01L 29/78642* (2013.01); *H01L 29/7926* (2013.01)

(56) References Cited

U.S. PATENT DOCUMENTS

| | | |
|---|---|---|
| 6,747,314 B2 * | 6/2004 | Sundaresan ..... H01L 21/823885 257/329 |
| 7,755,162 B2 | 7/2010 | Kurjanowicz et al. |
| 8,564,034 B2 * | 10/2013 | Masuoka .......... H01L 27/14616 250/208.1 |
| 8,669,601 B2 * | 3/2014 | Masuoka ................ H01L 21/84 257/291 |
| 8,779,492 B2 | 7/2014 | Takaishi et al. |
| 9,012,981 B2 * | 4/2015 | Masuoka ........ H01L 21/823885 257/329 |
| 9,129,687 B2 | 9/2015 | Kurjanowicz |
| 9,159,734 B2 | 10/2015 | Hafez et al. |
| 9,680,473 B1 | 6/2017 | Anderson et al. |
| 9,876,015 B1 | 1/2018 | Balakrishnan et al. |
| 9,899,100 B2 | 2/2018 | Jeong et al. |
| 9,917,090 B1 | 3/2018 | Cheng et al. |
| 2007/0148939 A1 * | 6/2007 | Chu ...................... H01L 29/778 438/590 |
| 2010/0264484 A1 * | 10/2010 | Masuoka ........ H01L 21/823828 257/329 |
| 2014/0179070 A1 | 6/2014 | Yang |
| 2016/0240533 A1 * | 8/2016 | Oxland ............... H01L 29/7827 |
| 2018/0061845 A1 | 3/2018 | Cheng et al. |

* cited by examiner

ONE-TIME PROGRAMMABLE DEVICE COMPATIBLE WITH VERTICAL TRANSISTOR PROCESSING

BACKGROUND

Vertical field-effect transistors (VFETs) (also referred to as vertical transport field effect transistors (VTFETs)) are becoming viable device options for scaling semiconductor devices (e.g., complementary metal oxide semiconductor (CMOS) devices) to 5 nanometer (nm) node and beyond. VFET devices include raised channel regions, referred to as fins, with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to address the limitations of horizontal device architectures in terms of, for example, density, performance, power consumption, and integration by, for example, decoupling gate length from the contact gate pitch.

One-time-programmable (OTP) devices have a variety of applications including chip identification, on-chip memory, cryptography, etc. A common OTP device is an anti-fuse device, which uses a single metal oxide semiconductor (MOS) transistor (1T). Programming such an anti-fuse device is done by breakdown of a gate dielectric. The logic state is determined by whether or not the gate dielectric breakdown occurs. For example, logic states "1" and "0" correspond to breakdown and no-breakdown, respectively.

A drawback of conventional 1T anti-fuse devices is that the location of gate dielectric breakdown is random, and may occur anywhere in the channel, or extension regions, resulting in large variations in the magnitude of current that is sensed to determine whether programming has occurred (e.g., to sense logic state "1"). The current variations make it difficult to accurately determine the occurrence of gate dielectric breakdown.

SUMMARY

According to an exemplary embodiment of the present invention, a method for manufacturing a semiconductor device includes forming a plurality of fins on a semiconductor substrate, forming a first bottom source/drain region at sides of a first fin of the plurality of fins in a first transistor region, and forming a second bottom source/drain region at sides of a second fin of the plurality of fins in a second transistor region. The first and second bottom source/drain regions are oppositely doped. In the method, a bottom spacer layer is formed on the first and second bottom source/drain regions, and the bottom spacer layer is removed from the second bottom source/drain region. A high-k dielectric layer is formed on the bottom spacer layer in the first transistor region, and directly formed on the second bottom source/drain region in the second transistor region. The method also includes forming a gate conductor on the high-k dielectric layer in the first and second transistor regions.

According to an exemplary embodiment of the present invention, a semiconductor device includes a first vertical channel region disposed in a first transistor region on a semiconductor substrate, and a second vertical channel region disposed in a second transistor region on the semiconductor substrate. A first bottom source/drain region is disposed adjacent a bottom portion of the first vertical channel region, and a second bottom source/drain region is disposed adjacent a bottom portion of the second vertical channel region. The first bottom source/drain region and the second bottom source/drain region are oppositely doped. The device also includes a bottom spacer layer disposed on the first bottom source/drain region. A high-k dielectric layer is disposed on the bottom spacer layer in the first transistor region, and directly on the second bottom source/drain region in the second transistor region. A gate conductor is disposed on the high-k dielectric layer in the first and second transistor regions.

According to an exemplary embodiment of the present invention, a method for manufacturing a one-time programmable device includes forming a plurality of fins on a semiconductor substrate, forming a first bottom source/drain region at sides of a bottom portion of a first fin of the plurality of fins in a first transistor region, and forming a second bottom source/drain region at sides of a bottom portion of a second fin of the plurality of fins in a second transistor region. The first bottom source/drain region and the second bottom source/drain region are oppositely doped. A bottom spacer layer is formed on the first bottom source/drain region, and a gate structure is formed on the bottom spacer layer in the first transistor region, and on the second bottom source/drain region in the second transistor region. The gate structure includes a gate dielectric layer contacting the second bottom source/drain region.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
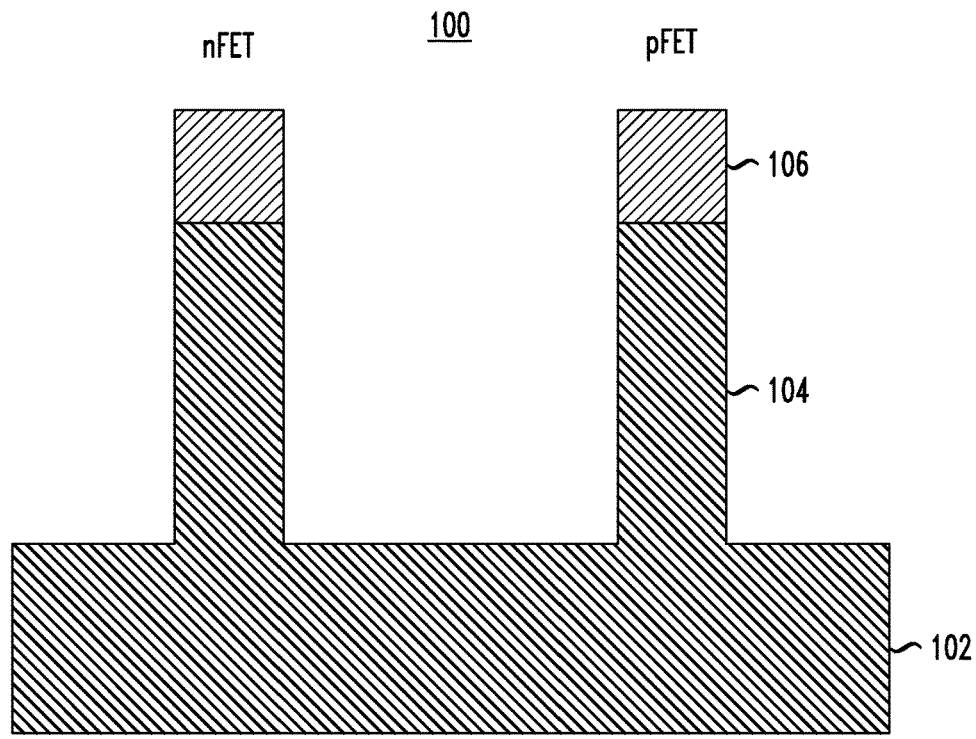
FIG. 1 is a cross-sectional view illustrating fin formation in a method of manufacturing a semiconductor device, according to an exemplary embodiment of the present invention.

Exemplary embodiments of the invention will now be discussed in further detail with regard to semiconductor devices and methods of manufacturing same and, in particular, to forming a one-time programmable device.

It is to be understood that the various layers and/or regions shown in the accompanying drawings are not drawn to scale, and that one or more layers and/or regions of a type commonly used in, for example, field-effect transistor (FET), fin field-effect transistor (FinFET), VFET, CMOS, nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not necessarily be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, FinFETs, VFETs, CMOSs, nanowire FETs, nanosheet FETs, SETs, and/or MOSFETs. By way of non-limiting example, the semiconductor devices can include, but are not necessarily limited to FET, FinFET, VFET, CMOS, nanowire FET, nanosheet FET, SET, CMOS and MOSFET devices, and/or semiconductor devices that use FET, FinFET, VFET, CMOS, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick," "thickness," "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick," "thickness," "thin" or derivatives thereof may be used in place of "width" or "length" where indicated.

As used herein, terms such as "upper," "lower," "right," "left," "vertical," "horizontal," "top," "bottom," and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on," "overlying," "atop," "on top," "positioned on" or "positioned atop" mean that a first element is present on a second element, wherein intervening elements may be present between the first element and the second element. As used herein, unless otherwise specified, the term "directly" used in connection with the terms "on," "overlying," "atop," "on top," "positioned on" or "positioned atop" or the term "direct contact" mean that a first element and a second element are connected without any intervening elements, such as, for example, intermediary conducting, insulating or semiconductor layers, present between the first element and the second element.

As used herein, "high-k" refers to dielectric materials having a relative dielectric constant greater than 7.

In accordance with one or more embodiments of the present invention, a vertical CMOS inverter structure includes a p-type field-effect transistor (pFET) with no bottom spacer between a high-k dielectric of a gate structure and bottom source/drain region. More specifically, a high-k gate dielectric of the pFET is positioned directly on the source/drain region, which, in an embodiment, is boron doped silicon germanium (SiGe:B). Due to poor interface quality between high-k gate dielectrics and, for example, boron or gallium doped SiGe or germanium, the gate dielectric on the bottom source/drain region in a pFET region is the weakest point for gate dielectric breakdown and programming to a logic state of "1". For example, a logic state of "0" refers to a fresh inverter including n- and p-type VFETs where the gate dielectrics have not been broken down. In order to perform one-time programming, a voltage is applied across the gate dielectric of the pFET, causing breakdown of the gate dielectric on the pFET source/drain region, resulting in shorting between the pFET gate and source/drain region, and a "1" logic state. The breakdown of the gate dielectric on the pFET drain side is due to poor interfacial quality between the gate dielectric and the p-type source/drain region.

The cross-sections in FIGS. 1-7 are taken perpendicular to the length of the fins along the substrate.

FIG. 1 is a cross-sectional view illustrating fin formation in a method of manufacturing a semiconductor device 100, according to an exemplary embodiment of the present invention. Referring to FIG. 1, a semiconductor substrate 102 includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-VI compound semiconductor or other like semiconductor. In addition, multiple layers of the semiconductor materials can be used as the semiconductor material of the substrate. The semiconductor substrate 102 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide, nitride layer or aluminum oxide.

Fins, such as fins 104, can be formed by patterning a portion of the semiconductor substrate 102 or a semiconductor layer on the substrate 102 into the fins 104. According to an embodiment, a hardmask 106 including, for example, a dielectric material, such as silicon nitride (SiN) is formed on portions of the semiconductor layer that are to be formed into the fins 104. The fin patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (RIE) processes. As a result, the spacers will have half the pitch of the mandrel. In other words, the pattern is transferred from a lithography-defined mandrel to spacers, where the pattern density is doubled. The spacer pattern can be used as the hard mask to form the fins by RIE processes. Alternatively, fin patterning can be done by any other suitable patterning technique, including but not limited to, lithography (e.g., extreme ultraviolet (EUV)) in conjunction with RIE, self-aligned double patterning (SADP), self-aligned multiple patterning (SAMP), and/or self-aligned quadruple patterning (SAQP)). While embodiments of the present invention describe channel regions as fins, the embodiments are not necessarily limited to fin channel regions, and may include nanowire channel regions. FIG. 1 illustrates two fins 104 on the substrate 102. Although two fins 104 are shown in the figures for ease of explanation, more than two fins can be formed.

Figure 2:
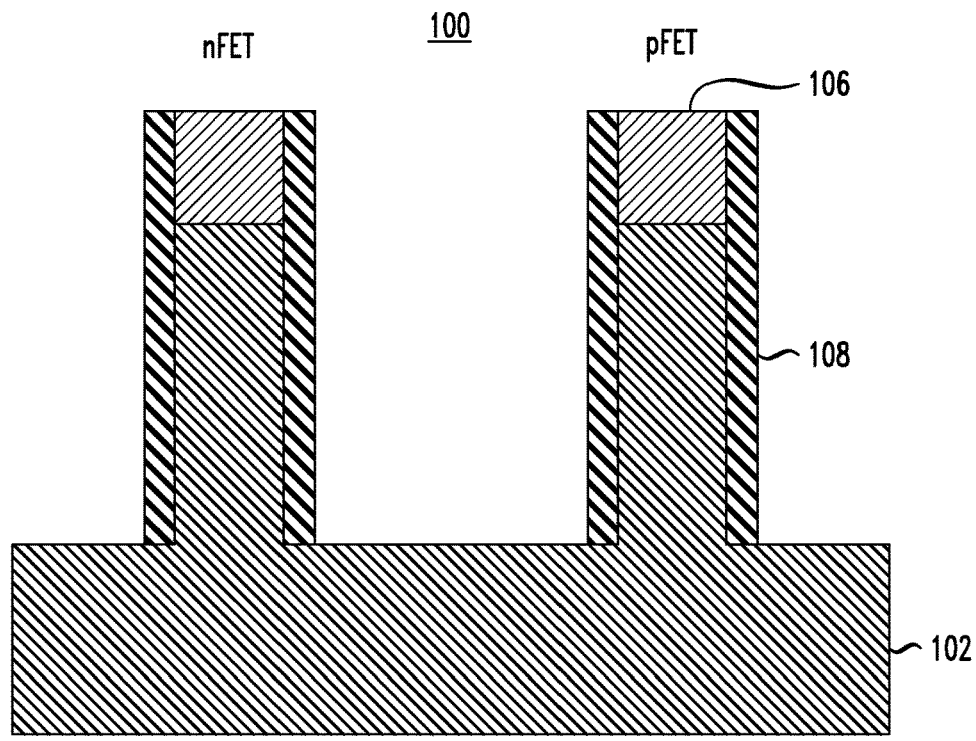
FIG. 2 is a cross-sectional view illustrating deposition and patterning of sacrificial liner layers in a method of manufacturing a semiconductor device, according to an exemplary embodiment of the present invention.

FIG. 2 is a cross-sectional view illustrating deposition and patterning of sacrificial liner layers in a method of manufacturing a semiconductor device, according to an exemplary embodiment of the present invention. Referring to FIG. 2, a dielectric layer is deposited on the fins 104, hardmasks 106 and on exposed surfaces of the substrate 102, and portions of the dielectric layer are removed to form sacrificial spacer layers 108 remaining on the vertical surfaces of each of the fins 104 and hardmasks 106. For example, horizontal portions of the dielectric layer are removed in an RIE process. The RIE process can be performed using, for example, $CH_4$, $CHF_3$, or $CH_2F_2$ chemistry. In accordance with an embodiment of the present invention, the dielectric layer comprises for example, an oxide/nitride bilayer. The oxide includes, but is not necessarily limited to, silicon oxide ($SiO_x$), where x is, for example, 2 in the case of silicon dioxide ($SiO_2$), or 1.99 or 2.01 or silicon oxycarbide (SiOC). The nitride includes, but is not necessarily limited to, SiN, silicon boron nitride (SiBN), siliconborocarbonitride (SiBCN) or some other dielectric. The layers 108 have a thickness of about 2 nm to about 10 nm.

The dielectric layer is deposited on the fins 104, hardmasks 106 and on exposed surfaces of the substrate 102 using, for example, deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering.

Figure 3:
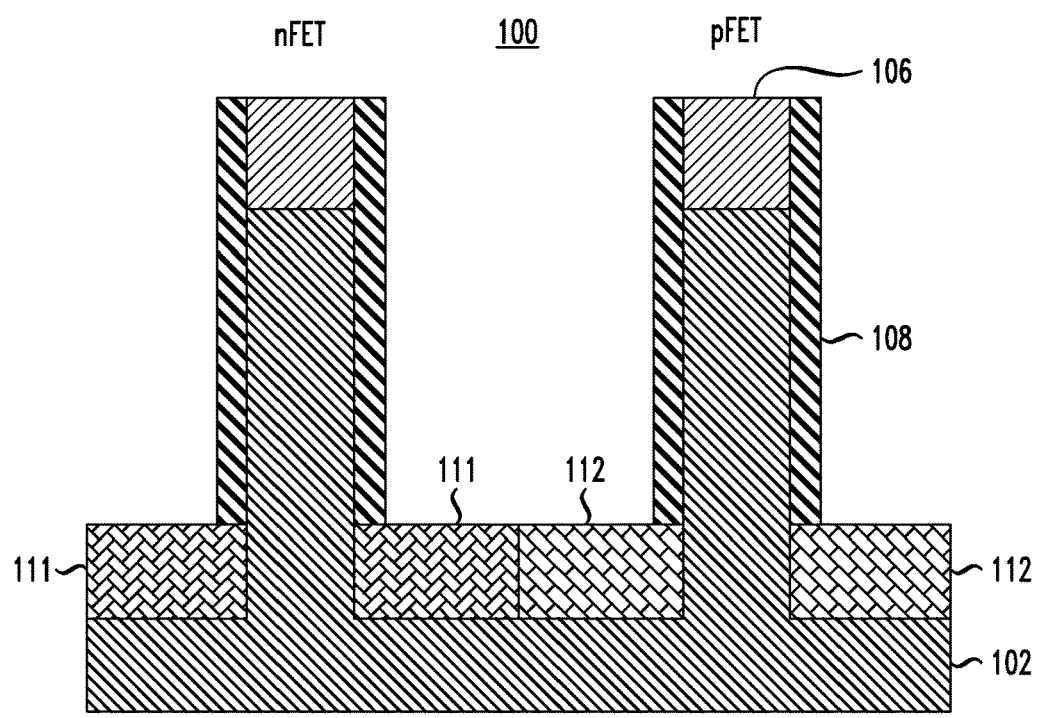
FIG. 3 is a cross-sectional view illustrating recessing of portions of a semiconductor substrate and epitaxial growth of bottom source/drain regions in a method of manufacturing a semiconductor device, according to an exemplary embodiment of the present invention.

FIG. 3 is a cross-sectional view illustrating recessing of portions of a semiconductor substrate and epitaxial growth of bottom source/drain regions in a method of manufacturing a semiconductor device, according to an exemplary embodiment of the present invention. Referring to FIG. 3, portions of the substrate 102 not covered by the hardmasks 106, and the spacers 108 are recessed to form recessed regions where source/drain regions 111 and 112 are subsequently formed. In a first part of the recessing (e.g., top down (or vertical) recessing) pedestal portions of substrate 102 aligned under the spacer and fin structures are formed. Each pedestal portion has a width of the fin 104 plus the width of the spacers 108 alongside each fin 104. The first part of the recessing of the substrate 102 is performed using directional RIE with fluorine or chlorine-based gases.

Following the first part of the recessing, the pedestal portions are trimmed to a width substantially the same or the same as a width of the fins 104 using, for example, an isotropic etch process. For example, a width of the fins 104 and the trimmed pedestal portions may be in the range of about 4 nm to about 20 nm. In the case of isotropic etching, the pedestal portions are trimmed to the desired width using for example, a suitable etch process selective to dielectric materials such as the fin hardmasks 106 and the material of the spacers 108 on fin sidewalls. In some embodiments, the etch is an isotropic process such as plasma etch, gas phase etch (e.g., hydrogen chloride (HCl)), or wet etch. Although shown in FIG. 3 that the width of the pedestal portions is the same as the width of the fins 104, in some embodiments, pedestal portions can be trimmed to a width that is less than the width of the fins 104.

Bottom source/drain regions 111 and 112 are formed in the recessed portions of the substrate 102. In one or more embodiments, the bottom source/drain regions 111 and 112 are formed by epitaxial growth processes. The epitaxially grown bottom source/drain regions 111 and 112 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, for silicon, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1 \times 10^{18}/cm^3$ to $3 \times 10^{21}/cm^3$.

The bottom source/drain regions 111 and 112 are respectively n-type and p-type. According to an embodiment, in order to form the source/drain regions 111 and 112 of different doping types, a first type region is masked while epitaxy and in-situ doping are performed in the second type region and vice versa. For example, the pFET region is covered with a mask, such as, for example, a hardmask (e.g., SiN), while epitaxial growth and in-situ doping are performed in the nFET region. For example, in a non-limiting embodiment, silicon is epitaxially grown and doped with phosphorous in the nFET region to form bottom source/drain region 111. Then, the mask is removed from the pFET region, another mask such as, for example, a hardmask, is deposited to cover the nFET region, and epitaxial growth and in-situ doping are performed in the pFET region. For example, in a non-limiting embodiment, SiGe is epitaxially grown and doped with boron in the pFET region to form the source/drain region 112. Other epitaxial materials, such as, for example, germanium, and other dopants, such as, for example, Ga, In and Tl may also be used in the pFET region as long as they result in a poor interface between the p-type source/drain region 112 and a high-k dielectric layer formed directly on the p-type source/drain region 112. As can be seen in FIG. 3, edges of portions of the source/drain regions 111 and 112 adjacent each other at a border between nFET and pFET regions are in contact. Alternatively, the source/drain regions 111 and 112 are separated by a portion of the substrate 102. The substrate 102 is typically undoped or doped with a doping concentration, which is typically less than $5\times10^{18}/cm^3$. In that case that the substrate 102 is doped, it can be doped with n-type dopants or p-type dopants.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 4:
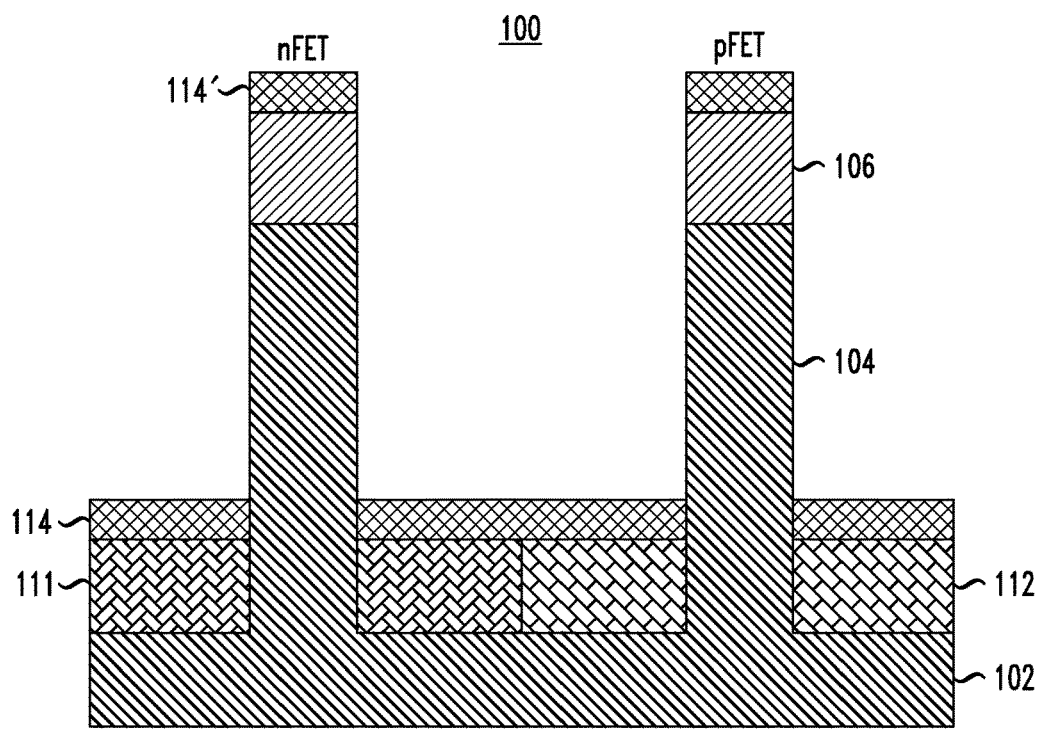
FIG. 4 is a cross-sectional view illustrating removal of the sacrificial liner layers and bottom spacer formation in a method of manufacturing a semiconductor device, according to an exemplary embodiment of the present invention.

FIG. 4 is a cross-sectional view illustrating removal of the sacrificial liner layers and bottom spacer formation in a method of manufacturing a semiconductor device, according to an exemplary embodiment of the present invention. Referring to FIG. 4, the sacrificial liner layers 108 are removed from the sides of the fins 104 and hardmasks 106 using, for example, silicon oxide can be removed by an aqueous solution containing hydrofluoric acid (HF) to remove silicon oxide, and an aqueous solution containing phosphoric acid ($H_3PO_4$) to remove silicon nitride. Following removal of the sacrificial liner layers 108, a bottom spacer layer 114 is formed on the bottom source/drain regions 111 and 112 in the nFET and pFET regions. The bottom spacer layer 114 includes, but is not necessarily limited to, SiBN, SiBCN, silicon oxycarbonitride (SiOCN), SiN or $SiO_x$. According to an embodiment of the present invention, the bottom spacer layer 114 is deposited using, for example, directional deposition techniques, including, but not necessarily limited to high density plasma (HDP) deposition and gas cluster ion beam (GCIB) deposition. The directional deposition deposits the spacer material preferably on the exposed horizontal surfaces, but not on lateral sidewalls. Spacer material layers 114' is also formed on the hardmasks 106. A thickness of the bottom spacer layer 114 and spacer material layers 114' is about 4 nm to about 10 nm.

Figure 5:
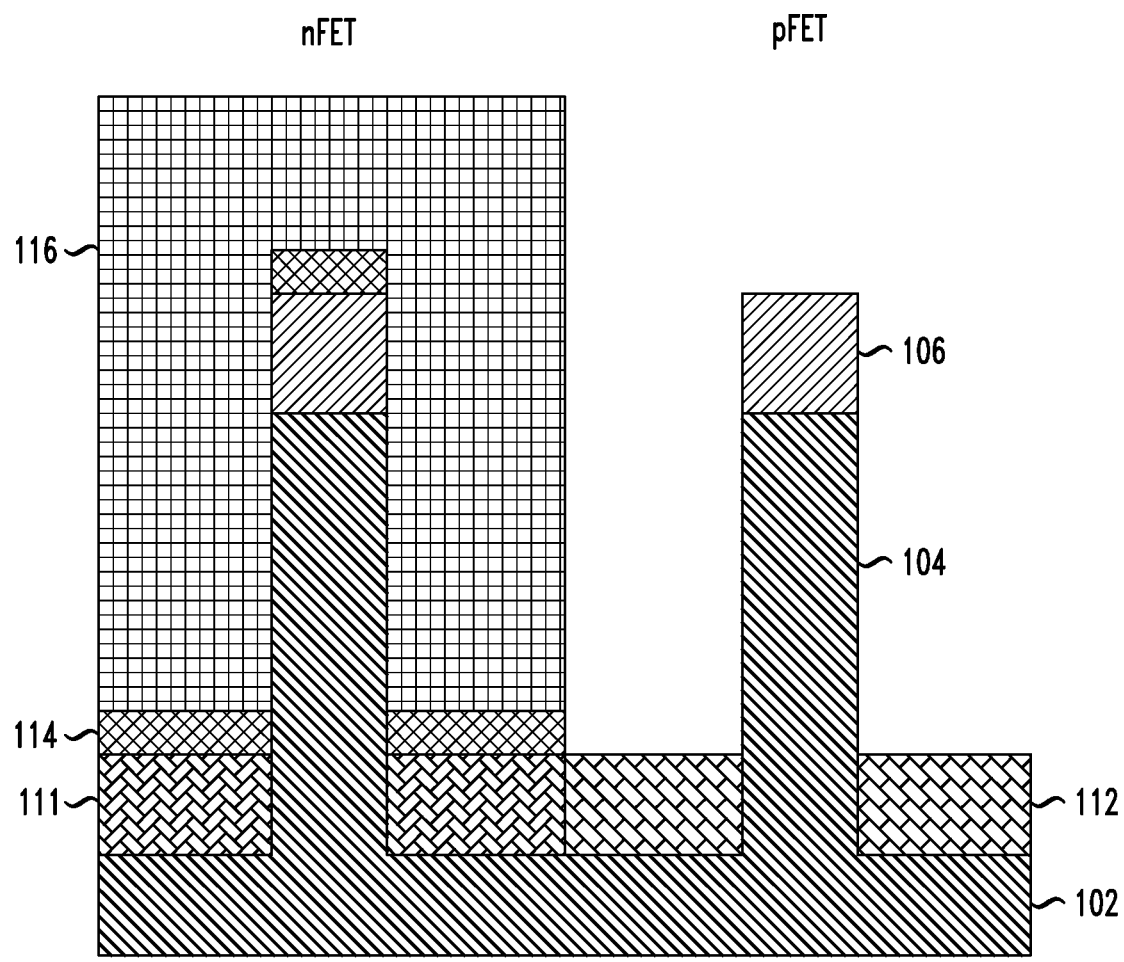
FIG. 5 is a cross-sectional view illustrating mask formation to cover an n-type transistor region and spacer removal from a p-type transistor region in a method of manufacturing a semiconductor device, according to an exemplary embodiment of the present invention.

FIG. 5 is a cross-sectional view illustrating mask formation to cover an n-type transistor region and spacer removal from a p-type transistor region in a method of manufacturing a semiconductor device, according to an exemplary embodiment of the present invention. Referring to FIG. 5, a mask 116 such as, for example, a hardmask (e.g., SiN), or soft mask (e.g., photoresist, polymer, amorphous carbon), is formed in the nFET region to cover the portions of the bottom spacer and spacer material layers 114 and 114' in the nFET region, leaving exposed the portions of the bottom spacer and spacer material layers 114 and 114' in the pFET region. Then, the portions of the bottom spacer and spacer material layers 114 and 114' are removed from the pFET region with, for example, an isotropic etch process using, for example, aqueous solution containing phosphoric acid ($H_3PO_4$), or an anisotropic etch process (e.g., ME) using a gas mixture containing $CF_4/N_2/O_2$ to remove silicon nitride. The removal of the portions of the bottom spacer and spacer material layers 114 and 114' from the pFET region exposes the upper surfaces of the source/drain regions 112 in the pFET region.

Figure 6:
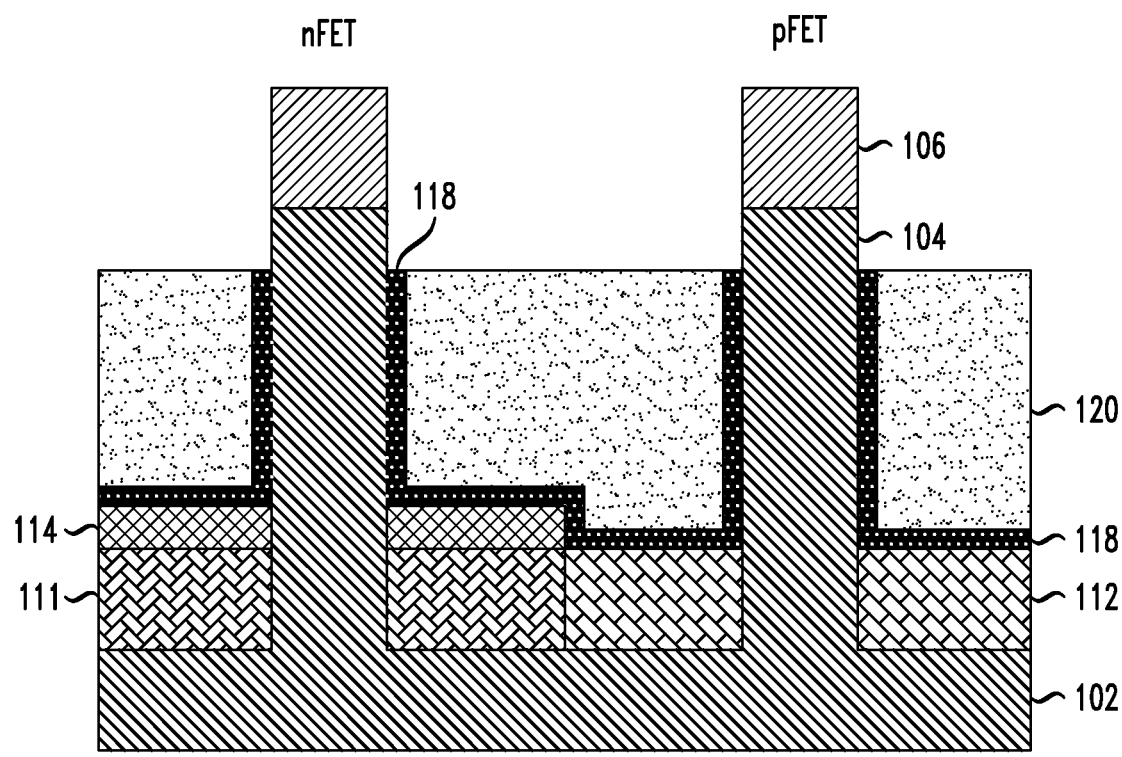
FIG. 6 is a cross-sectional view illustrating mask removal, and high-k dielectric layer and gate conductor layer formation, according to an exemplary embodiment of the present invention.

FIG. 6 is a cross-sectional view illustrating mask removal, and high-k dielectric layer and gate conductor layer formation, according to an exemplary embodiment of the present invention. Referring to FIG. 6, the mask 116 is removed from the nFET region using, for example, oxygen plasma etching, an ozone-based ashing process, a plasma with a mixture of $N_2$ and $H_2$, or a wet etch containing sulfuric acid ($H_2SO_4$) and hydrogen peroxide ($H_2O_2$) to remove a photoresist or polymer.

In accordance with an embodiment, the gate structures including a gate dielectric layer 118 and a gate conductor layer 120 are formed in the nFET and pFET regions. As can be seen, due to the removal of the portion of the bottom spacer layer 114 from the pFET region, the high-k dielectric layers 118 are directly formed on exposed upper surfaces of the source/drain regions 112 in the pFET region, but are formed on the bottom spacer layer 114 in the nFET region. The bottom spacer layer 114 is between the source/drain regions 111 and the high-k dielectric layers 118 in the nFET region. The high-k dielectric layer 118 contacts the source/ drain region 112 in the pFET region. As can be seen in FIG. 6, the high-k dielectric layer 118 on the source/drain region 112 in the pFET region is at a lower height with respect to the substrate 102 than the high-k dielectric layer 118 on the bottom spacer layer 114 in the nFET region.

The high-k dielectric layers 118 are formed of, for example, high-k materials including, but not necessarily limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. The high-k dielectric material can be formed by any suitable process or any suitable combination of multiple processes, including but not necessarily limited to, thermal oxidation, chemical oxidation, thermal nitridation, plasma oxidation, plasma nitridation, ALD, CVD, etc. In some embodiments, the high-k dielectric layers 118 have a thickness ranging from about 1 nm to about 5 nm, although less and greater thicknesses are also possible.

The gate structures further include a gate conductor layer 120 formed on the high-k dielectric layer 118. The gate conductor layers 120 can comprise any suitable conducting material, including but not necessarily limited to, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au)), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, carbon nanotube, conductive carbon, graphene, or any suitable combination of these materials. The conductive material may further comprise dopants that are incorporated during or after deposition. In some embodiments, the gate structures may further comprise a work function setting layer between a gate dielectric 118 and a gate conductor 120. The work function setting layer can be a work function metal (WFM). WFM can be any suitable material, including but not limited to, a nitride, including but not limited to, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to, titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor 120 and WFM. The gate conductor 120 and WFM can be formed by any suitable process or any suitable combination of multiple processes, including but not limited to, ALD, CVD, PVD, sputtering, plating, evaporation, ion beam deposition, electron beam deposition, laser assisted deposition, chemical solution deposition, etc. The gate structures function as gate electrodes in an operational device. nFET and pFET devices may have different WFMs.

Following deposition of the gate structures including the high-k dielectric and gate conductor layers 120, a planarization process, such as, for example, chemical mechanical polishing (CMP), is performed down to the hardmasks 106. Remaining spacer material 114 formed on the hardmask 106 in the nFET region is removed during the planarization process.

Following the planarization process, the gate structures including the high-k dielectric and gate conductor layers 120 are recessed to a height below the top surfaces of the fins 104. The recessing can be performed using for example, an anisotropic etch process, such as ME, ion beam etching, plasma etching or laser ablation.

Figure 7:
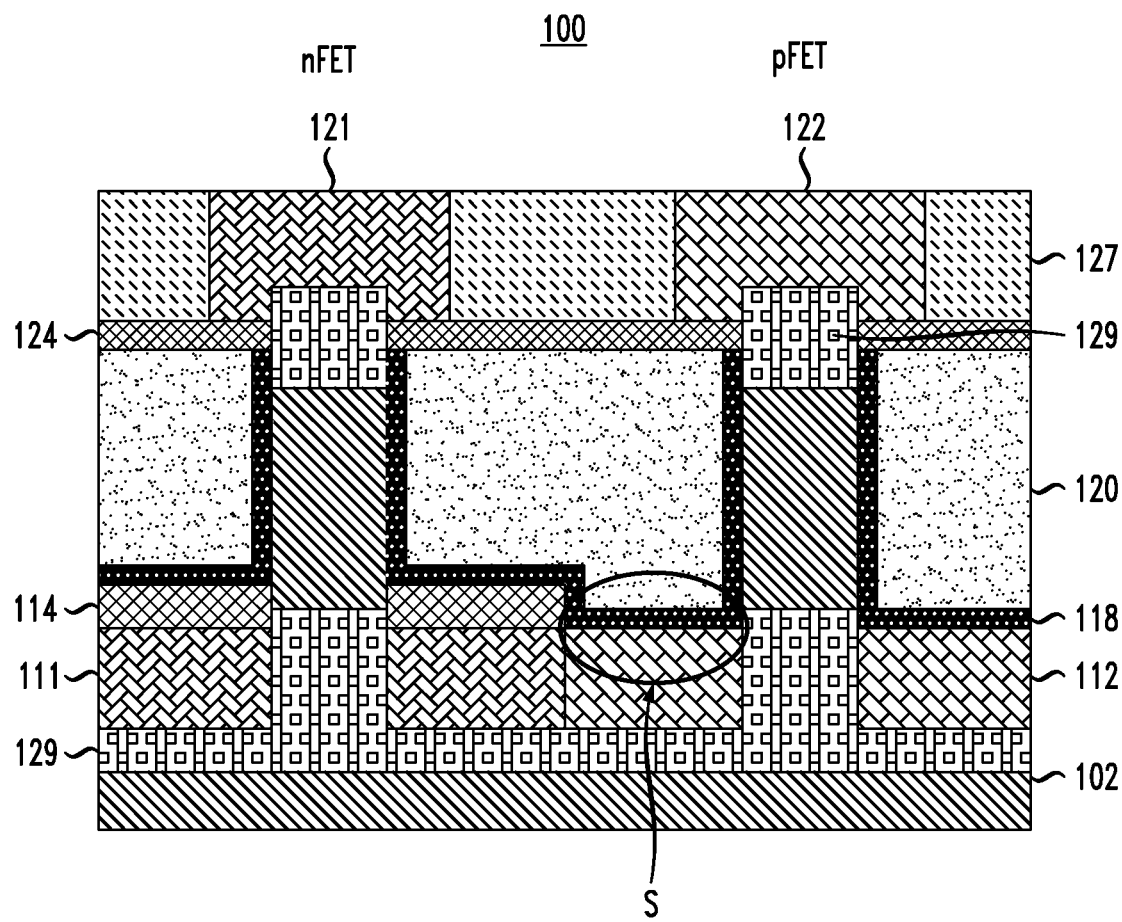
FIG. 7 is a cross-sectional view illustrating top spacer, inter-layer dielectric (ILD) layer, top source/drain and junction formation in a method of manufacturing a semiconductor device, according to an exemplary embodiment of the present invention.

FIG. 7 is a cross-sectional view illustrating top spacer, inter-layer dielectric (ILD) layer, top source/drain and junction formation in a method of manufacturing a semiconductor device, according to an exemplary embodiment of the present invention. Referring to FIG. 7, a top spacer layer 124 is formed on the recessed gate structure, including the gate conductor and high-k gate dielectric layers 120 and 118, and on the fins 104 including the hardmasks 106 thereon. The top spacer layer 124 includes, but is not necessarily limited to, SiBN, SiBCN, SiOCN, SiN or $SiO_x$. According to an embodiment of the present invention, the top spacer layer 124 is deposited using, for example, directional deposition techniques, including, but not necessarily HDP deposition and GCIB deposition. The directional deposition deposits the spacer material preferably on the exposed horizontal surfaces, but not on lateral sidewalls. Alternatively, the spacer material can be deposited using, conformal deposition techniques, and removed from vertical surfaces using directional removal techniques, such as, for example, RIE.

Portions of the deposited top spacer material and the hardmasks 106 are removed from the upper surfaces of the fins 104, using for example, a planarization process, such as, for example, CMP. Alternatively, the portions of the deposited top spacer material and the hardmasks 106 can be removed by selective etch.

The top source/drain regions 121 and 122 are epitaxially grown in epitaxial growth processes from the upper portions of the fins 104. Similar to the bottom source/drain regions 111 and 112, the epitaxially grown top source/drain regions 121 and 122 can be in-situ doped, or other alternative doping techniques can be used, including but not limited to, ion implantation, gas phase doping, plasma doping, plasma immersion ion implantation, cluster doping, infusion doping, liquid phase doping, solid phase doping, etc., and dopants may include, for example, an n-type dopant selected from a group of P, As and Sb, and a p-type dopant selected from a group of B, Ga, In, and Tl at various concentrations. For example, in a non-limiting example, a dopant concentration range may be $1 \times 10^{19}/cm^3$ to $3 \times 10^{21}/cm^3$.

Like the bottom/source drain regions 111 and 112, the top source/drain regions 121 and 122 are respectively n-type and p-type. According to an embodiment, in order to form the source/drain regions 121 and 122 of different doping types, a first type region is masked while epitaxy and in-situ doping are performed in the second type region and vice versa. For example, the pFET region is covered with a mask, such as, for example, a hardmask, soft mask, or photoresist, while epitaxial growth and in-situ doping are performed in the nFET region. For example, in a non-limiting embodiment, silicon is epitaxially grown and doped with phosphorous in the nFET region to form the top source/drain region 121. Then, the mask is removed from the pFET region, another mask such as, for example, a hardmask, soft mask or photoresist, is deposited to cover the nFET region, and epitaxial growth and in-situ doping are performed in the pFET region. For example, in a non-limiting embodiment, SiGe is epitaxially grown and doped with B in the pFET region to form source/drain region 122.

Following top source/drain region 121, 122 formation, a dielectric material is deposited to form inter-layer dielectric (ILD) layer 127 on the top spacer layer 124 and on and around the source/drain regions 121 and 122. The ILD material comprises, for example, $SiO_x$, SiOC or some other dielectric, and is deposited using, for example, deposition techniques including, but not limited to, CVD, PECVD, RFCVD, PVD, ALD, MLD, MBD, PLD, LSMCD, sputtering, and/or plating, followed by a planarization process, such as, for example, CMP.

Source/drain junction regions 129 between the bottom source/drain regions 111, 112 and the fins 104, and between the top source/drain regions 121, 122 and the fins 104 are formed by an annealing process which causes dopant diffusion. More specifically, the doped junction regions 129 are formed by dopant diffusion from the bottom source/drain regions 111, 112 and the top source/drain regions 121, 122 into lower and upper portions of the fins 104 and parts of the substrate 102 under the bottom source/drain regions 111, 112 and lower portions of the fins 104. The annealing process can be, for example, a drive-in annealing process performed at temperatures in the range of, for example, about 800° C. to 1300° C. and for durations in the range of, for example, about 0.01 seconds to 10 minutes. The annealing process can be performed using annealing techniques including, but not limited to, laser anneal, rapid thermal anneal, flash anneal, furnace anneal, or any suitable combination of those techniques. In some embodiments, the anneal process is omitted. The fins 104 function as channel regions of the resulting n-type and p-type vertical transistors in the nFET and pFET regions.

As shown in FIG. 7, the lack of the bottom spacer 114 in the pFET region results in the high-k dielectric layer 118 being directly formed on the bottom source/drain region 112 in the pFET region. As a result of the poor interfacial relationship between the bottom source/drain region 112 and the high-k dielectric 118, the high-k dielectric 118 in the pFET region (as shown by arrow S) is easily broken down upon application of a voltage to the dielectric layer 118 in the pFET region, such that a gate to source/drain region short (e.g., anti-fuse) can be created to program the OTP device. According to an embodiment, the source/drain region 112 comprises SiGe:B.

Figure 8A:
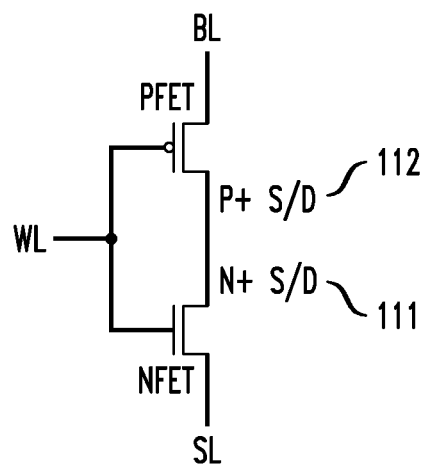
FIG. 8A is a circuit diagram illustrating n-type and p-type transistors in a logic "0" state, according to an exemplary embodiment of the present invention.
Figure 8B:
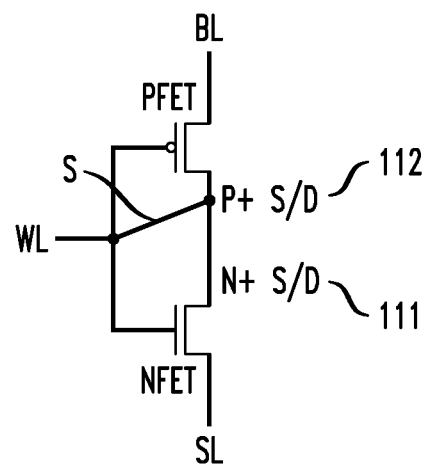
FIG. 8B is a circuit diagram illustrating n-type and p-type transistors in a logic "1" state, according to an exemplary embodiment of the present invention.

FIGS. 8A and 8B are circuit diagrams respectively illustrating n-type and p-type transistors in logic "0" and logic "1" states, according to an exemplary embodiment of the present invention. The logic state of the fresh inverter in FIG. 8A is assigned as "0". The circuit diagram in FIG. 8A represents a device, such as device 100 where the gate dielectric 118 in the pFET region has not been broken down (i.e., there is no short) and the device can function as an inverter with an intact nFET and pFET. Referring to FIG. 8B, in order to program logic "1", the wordline (WL) is biased at $-V_{dd}$, the bitline (BL) is biased at $V_{dd}$, so that the pFET is on ($V_{gs}=-2V_{dd}$). A voltage of $2V_{dd}$ is across the gate dielectric (e.g., gate dielectric 118) of the pFET, causing the gate dielectric on the pFET source/drain region 112 to breakdown due to poor quality of the gate dielectric 118 on the source/drain region 112 (e.g., SiGe:B). The nFET remains in the off state during programming. The source line (SL) voltage and current are 0 during programming.

According to an embodiment, in a "standby" state, WL, BL, and SL are grounded (0V), and no current flows in the device. According to an embodiment, in a "read" operation, WL is biased at $V_{dd}$, BL and SL are grounded (0V), and the nFET channel is on. At logic "0" in the "read" operation, the inverter current is close to 0 except for the intrinsic leakage current of transistors. At logic "1" in the "read" (sometimes referred as "sensing") operation, since the source/drain 112 of the pFET is shorted to the gate ($V_{dd}$), the P+/N+ junction is forward biased, Vas of the nFET is greater than 0, and current flows in the SL line. This corresponds to the case shown in FIGS. 3-7 where P+ and N+ bottom source/drain regions (e.g., source/drain regions 111, 112) directly contact each other.

Alternatively, as discussed herein above, P+ and N+ bottom source/drain regions can be separated by a portion of the substrate (e.g., substrate 102). The substrate can be either undoped or doped with a doping concentration lower than that of the P+ or N+ region. If a portion of the substrate separates the P+ and N+ bottom source/drain regions and is undoped, in the "read" operation, instead of a forward biased P+/N+ junction, the result is a PiN junction (i refers to intrinsic or undoped). If a portion of the substrate separates the P+ and N+ bottom source/drain regions and is lightly doped, the result is a P+/P−/N+ or a or P+/N−/N+ junction. If the substrate is lightly doped with p-type dopants, P− refers to lightly doped with p-type dopants). If the substrate is lightly doped with n-type dopants, N− refers to lightly doped with n-type dopants.

No current flows in the SL line in the "read" state at logic "0". As a result, a logic "1" state or a programmed device can be detected by measuring a current in SL ($I_{SL}$). $I_{SL}$ in the logic "1" state can be, for example, in the range of micro- to milli-amps. $I_{SL}$ is the logic "0" state is effectively 0, although there may be some leakage current in the range of pico- or nano-amps.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   forming a plurality of fins on a semiconductor substrate;
   forming a first bottom source/drain region at sides of a first fin of the plurality of fins in a first transistor region;
   forming a second bottom source/drain region at sides of a second fin of the plurality of fins in a second transistor region;
   wherein the first bottom source/drain region and the second bottom source/drain region are oppositely doped;
   forming a bottom spacer layer on the first and second bottom source/drain regions;
   removing the bottom spacer layer from the second bottom source/drain region;
   forming a high-k dielectric layer on the bottom spacer layer in the first transistor region, and directly on the second bottom source/drain region in the second transistor region; and
   forming a gate conductor on the high-k dielectric layer in the first and second transistor regions.

2. The method according to claim 1, wherein the first transistor region is an n-type transistor region and the second transistor region is a p-type transistor region.

3. The method according to claim 1, wherein the first bottom source/drain region is an n-type region and the second bottom source/drain region is a p-type region.

4. The method according to claim 1, wherein the second bottom source/drain region comprises one of silicon germanium and germanium.

5. The method according to claim 1, wherein removing the bottom spacer layer from the second bottom source/drain region comprises:
   covering the bottom spacer layer in the first transistor region with a mask; and
   etching the bottom spacer layer in the second transistor region.

6. The method according to claim 5, wherein the mask further covers the first fin.

7. The method according to claim 1, further comprising:
   forming sacrificial liner layers on the first and second fins of the plurality of fins; and
   removing portions of the semiconductor substrate located under the sacrificial liner layers and located at the sides of the first and second fins of the plurality of fins;
   wherein the first and second source/drain regions are positioned in place of the removed portions of the semiconductor substrate.

8. The method according to claim 1, wherein the high-k dielectric layer on the second bottom source/drain region in the second transistor region is at a lower height than the high-k dielectric layer on the bottom spacer layer in the first transistor region.

9. The method according to claim 1, further comprising forming a top spacer layer on the gate conductor in the first and second transistor regions.

10. The method according to claim 1, further comprising:
    growing a first top source/drain region from a top of the first fin of the plurality of fins; and
    growing a second top source/drain region from a top of the second fin of the plurality of fins.

11. The method according to claim 10, wherein the first top source/drain region and the second top source/drain region are oppositely doped.

12. The method according to claim 1, wherein the first fin is adjacent the second fin.

13. A semiconductor device, comprising:
    a first vertical channel region disposed in a first transistor region on a semiconductor substrate;
    a second vertical channel region disposed in a second transistor region on the semiconductor substrate;
    a first bottom source/drain region disposed adjacent a bottom portion of the first vertical channel region;
    a second bottom source/drain region disposed adjacent a bottom portion of the second vertical channel region;
    wherein the first bottom source/drain region and the second bottom source/drain region are oppositely doped;
    a bottom spacer layer disposed on the first bottom source/drain region;
    a high-k dielectric layer disposed on the bottom spacer layer in the first transistor region, and directly on the second bottom source/drain region in the second transistor region; and
    a gate conductor disposed on the high-k dielectric layer in the first and second transistor regions.

14. The semiconductor device according to claim 13, wherein the first transistor region is an n-type transistor region and the second transistor region is a p-type transistor region.

15. The semiconductor device according to claim 13, wherein the first bottom source/drain region is an n-type region and the second bottom source/drain region is a p-type region.

16. The semiconductor device according to claim 13, wherein the second bottom source/drain region comprises one of silicon germanium and germanium.

17. The semiconductor device according to claim 13, wherein the high-k dielectric layer disposed on the second bottom source/drain region in the second transistor region is at a lower height than the high-k dielectric layer disposed on the bottom spacer layer in the first transistor region.

18. The semiconductor device according to claim 13, further comprising:
    a top spacer layer disposed on the gate conductor in the first and second transistor regions;
    a first top source/drain region disposed on the first vertical channel region; and
    a second top source/drain region disposed on the second vertical channel region;
    wherein the first top source/drain region and the second top source/drain region are oppositely doped.

19. A method for manufacturing a one-time programmable device, comprising:
    forming a plurality of fins on a semiconductor substrate;
    forming a first bottom source/drain region at sides of a bottom portion of a first fin of the plurality of fins in a first transistor region;
    forming a second bottom source/drain region at sides of a bottom portion of a second fin of the plurality of fins in a second transistor region;
    wherein the first bottom source/drain region and the second bottom source/drain region are oppositely doped;
    forming a bottom spacer layer on the first bottom source/drain region;
    forming a first gate structure on the bottom spacer layer in the first transistor region; and
    forming a second gate structure on the second bottom source/drain region in the second transistor region;
    wherein the second gate structure comprises a gate dielectric layer contacting the second bottom source/drain region.

20. The method according to claim 19, wherein the first bottom source/drain region is an n-type region and the second bottom source/drain region is a p-type region.

* * * * *